(12) United States Patent
Park

(10) Patent No.: US 10,101,406 B2
(45) Date of Patent: Oct. 16, 2018

(54) METHOD AND APPARATUS FOR ESTIMATING STATE OF BATTERY

(71) Applicant: SAMSUNG ELECTRONICS CO., LTD., Suwon-si (KR)

(72) Inventor: SangDo Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 393 days.

(21) Appl. No.: 14/794,190

(22) Filed: Jul. 8, 2015

(65) Prior Publication Data

US 2016/0161567 A1   Jun. 9, 2016

(30) Foreign Application Priority Data

Dec. 4, 2014   (KR) .................. 10-2014-0173008

(51) Int. Cl.
  *G01R 31/36*   (2006.01)
(52) U.S. Cl.
  CPC ..... *G01R 31/3679* (2013.01); *G01R 31/3648* (2013.01)
(58) Field of Classification Search
  CPC . G01R 31/3679; G01R 31/3648; G01R 31/36
  USPC ......................................................... 702/63
  See application file for complete search history.

(56) References Cited

U.S. PATENT DOCUMENTS

| | | | |
|---|---|---|---|
| 6,377,030 B1 | 4/2002 | Asao et al. | |
| 8,332,342 B1 | 12/2012 | Saha et al. | |
| 2015/0008929 A1* | 1/2015 | Ehrmann | B60L 3/0046 324/426 |
| 2015/0369874 A1 | 12/2015 | Park et al. | |
| 2016/0243957 A1* | 8/2016 | Boehm | B60L 11/1857 |
| 2017/0115355 A1* | 4/2017 | Willard | G01R 31/361 |

FOREIGN PATENT DOCUMENTS

| | | |
|---|---|---|
| JP | 2007-178401 A | 7/2007 |
| JP | 4474095 B2 | 6/2010 |
| JP | 2013-44598 A | 3/2013 |
| JP | 2014-70982 A | 4/2014 |
| JP | 2014-123393 A | 7/2014 |
| KR | 10-1065551 B1 | 9/2011 |
| KR | 10-2012-0079808 A | 7/2012 |
| KR | 10-2012-0119598 A | 10/2012 |
| KR | 10-1398465 B1 | 5/2014 |
| KR | 10-1399340 B1 | 5/2014 |
| KR | 10-2014-0075931 A | 6/2014 |

\* cited by examiner

*Primary Examiner* — Caleb Henry
(74) *Attorney, Agent, or Firm* — NSIP Law

(57) ABSTRACT

A method and apparatus for estimating a state of a battery are provided. A battery life estimation apparatus includes a time information accumulator configured to partition sensing data of a battery into sections, and to accumulate time information corresponding to the sections. The battery life estimation apparatus also includes a time information extractor configured to extract time information corresponding to a period from the accumulated time information. The battery life estimation apparatus further includes a life estimator configured to extract expected time information based on the accumulated time information, the time information corresponding to the period, and learning information, and configured to estimate an end of life (EOL) of the battery based on the expected time information.

26 Claims, 19 Drawing Sheets

FIG. 13

|    | 1 day | 1 week | 1 month | 6 months | 1 year |
|----|-------|--------|---------|----------|--------|
| V1 | 10    | 65     | 310     | 2000     | 3850   |
| V2 | 21    | 150    | 500     | 2700     | 5500   |
| ... |      |        |         |          |        |
| Vn | 2     | 10     | 55      | 300      | 700    |
| I1 | 40    | 240    | 1000    | 5000     | 9750   |
| I2 | 10    | 60     | 250     | 570      | 1000   |
| ... |      |        |         |          |        |
| In | 1     | 5      | 21      | 100      | 210    |
| T1 | 2     | 8      | 40      | 260      | 660    |
| T2 | 4     | 30     | 130     | 610      | 1210   |
| ... |      |        |         |          |        |
| Tn | 30    | 180    | 710     | 3800     | 7600   |

METHOD AND APPARATUS FOR ESTIMATING STATE OF BATTERY

CROSS-REFERENCE TO RELATED APPLICATION(S)

This application claims the benefit under 35 USC 119(a) of Korean Patent Application No. 10-2014-0173008 filed on Dec. 4, 2014, in the Korean Intellectual Property Office, the entire disclosure of which is incorporated herein by reference for all purposes.

BACKGROUND

1. Field

The following description relates to a method and apparatus to estimate a working state of a battery.

2. Description of Related Art

As environmental concerns and energy resource issues become more important, an electric vehicle (EV) has been highlighted as a vehicle of the future. The EV does not emit exhaust gas, and produces less noise because a battery formed in a single pack with a plurality of rechargeable and dischargeable secondary cells is used as a main power source in the EV.

In the EV, the battery functions as a fuel tank and an engine of a gasoline powered vehicle. Thus, to enhance a safety of a user of the EV, checking a state of the battery is relevant.

Recently, research is being conducted to increase user confidence in the EV by accurately monitoring a working state of the battery.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided a battery life estimation apparatus, including a time information accumulator configured to partition sensing data of a battery into sections, and to accumulate time information corresponding to the sections; a time information extractor configured to extract time information corresponding to a period from the accumulated time information; and a life estimator configured to extract expected time information based on the accumulated time information, the time information corresponding to the period, and learning information, and configured to estimate an end of life (EOL) of the battery based on the expected time information.

The time information accumulator may be further configured to measure at least one of a voltage signal, a current signal, and a temperature signal of the battery in real time.

The time information extractor may be further configured to set the period based on a usage history of the battery.

The battery life estimation apparatus may also include a charge/discharge determiner configured to determine, based on a current signal of the battery, whether the battery is being charged or discharged.

The life estimator may be further configured to extract the expected time information by predicting a change in the accumulated time information due to battery use, to add the time information corresponding to each of periods, which includes the period, to the accumulated time information in an order of a longest period to a shortest period among the periods, and to extract the expected time information.

In response to pieces of time information corresponding to each period, the life estimator may be further configured to extract the expected time information, based on time information corresponding to sensed data among the pieces of time information.

The life estimator may be further configured to set the accumulated time information as the expected time information, and to update the expected time information by adding the time information corresponding to each of the periods to the expected time information.

The life estimator may be further configured to estimate a life of the battery based on the updated expected time information and the learning information, and configured to update, for each of the periods, the expected time information by adding the time information corresponding to each of the periods to the expected time information until the estimated life of the battery does not end.

The life estimator may be further configured to add time information corresponding to an n-th period to the expected time information, to which time information corresponding to each of a first period, as the longest period, through an (n−1)-th period is added until the estimated life of the battery does not end.

The life estimator may be further configured to estimate the EOL by adding up periods of time corresponding to the time information added to the accumulated time information.

The life estimator may be further configured to estimate a capacity of the battery based on the updated expected time information and the learning information, and configured to estimate the life of the battery based on the capacity of the battery.

The life estimator may be further configured to determine an end of the life of the battery, in response to the estimated capacity of the battery being less than 0.8 times an initial capacity of the battery.

The battery life estimation apparatus may also include a dimension transformer configured to transform an input vector corresponding to the expected time information to reduce a dimension of the input vector, wherein the life estimator may be further configured to estimate the capacity of the battery based on the transformed input vector and the learning information.

The life estimator may be further configured to estimate the capacity of the battery from the longest period to the shortest period by transmitting the transformed input vector and the learning information to a learner.

The learner may include one of a neural network, a hidden Markov model (HMM), a Bayesian network, a support vector machine (SVM), and a decision tree (DT).

The life estimator may be further configured to receive the learning information from an external apparatus using a communication interface.

In accordance with an embodiment, there is provided a battery life estimation apparatus, including a training time information accumulator configured to partition training data of a battery into sections, and to accumulate training time information corresponding to the sections; a learning information determiner configured to determine learning information, based on the accumulated training time information and reference information, to estimate an end of life (EOL) of the battery; a time information accumulator configured to partition sensing data of the battery into sections, and to accumulate time information corresponding to the sections; a time information extractor configured to extract time information corresponding to a period from the accumulated time information; and a life estimator configured to extract expected time information by predicting a change in the accumulated time information due to battery use, based on the accumulated time information, the time information corresponding to the period, and the learning information, and configured to estimate the EOL based on the expected time information.

The battery life estimation apparatus may also include a training data acquirer configured to acquire the training data of the battery and to measure at least one of a voltage signal, a current signal, and a temperature signal of the battery in real time.

The learning information determiner may be further configured to learn a parameter corresponding to the learning information by transmitting the accumulated time information and the reference information to a learner.

The learning information determiner may be further configured to transmit the learning information to an external apparatus using a communication interface.

In accordance with an embodiment, there is provided a method to estimate a life of a battery including accumulating time information corresponding to sections of partitioned sensing data; extracting time information corresponding to a period from the accumulated time information; extracting expected time information based on the accumulated time information, the extracted time information, and usage history information of the battery; and estimating an end of life (EOL) of the battery based on the expected time information.

The method may also include extracting the expected time information by predicting a change in the accumulated time information due to battery use; and adding the time information corresponding to each of periods, which includes the period, to the accumulated time information in an order of a longest period to a shortest period among the periods.

The method may also include setting the accumulated time information as the expected time information, and to update the expected time information by adding the time information corresponding to each of the periods to the expected time information.

The method may also include estimating a life of the battery based on the updated expected time information and the learning information; and updating, for each of the periods, the expected time information by adding the time information corresponding to each of the periods to the expected time information until the estimated life of the battery does not end.

The method may also include estimating a capacity of the battery based on the updated expected time information and the learning information; and estimating the life of the battery based on the capacity of the battery.

The method may also include determining an end of the life of the battery, in response to the estimated capacity of the battery being less than 0.8 times an initial capacity of the battery.

Other features and aspects will be apparent from the following detailed description, the drawings, and the claims.

BRIEF DESCRIPTION OF THE DRAWINGS

FIG. 13 illustrates an example of time information corresponding to at least one period, in accordance with an embodiment.

Figure 1:
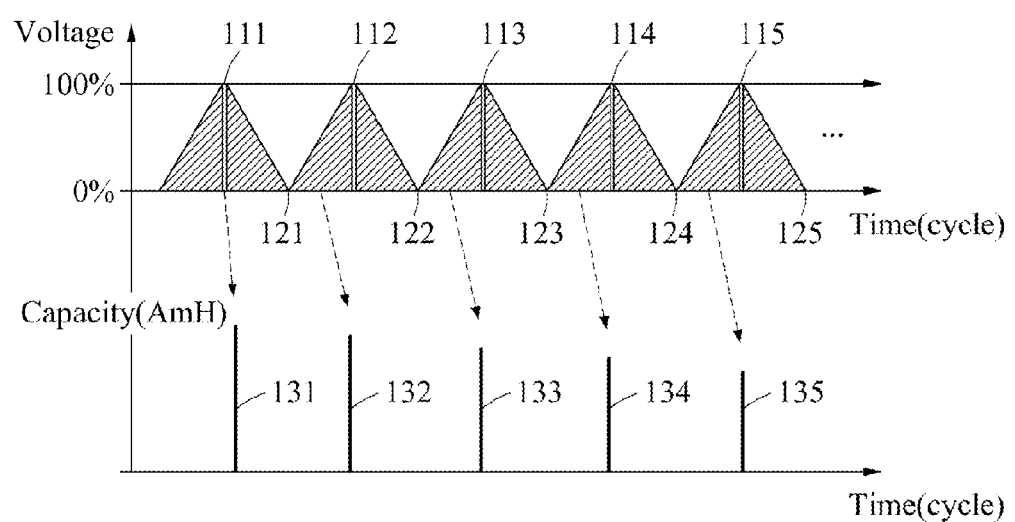
FIG. 1 illustrates an example of a charge and discharge (charge/discharge) cycle of a battery, in accordance with an embodiment.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, embodiments will be described in detail with reference to the accompanying drawings, wherein like reference numerals refer to like elements throughout.

Various alterations and modifications may be made to the embodiments, some of which will be illustrated in detail in the drawings and detailed description. However, it should be understood that these embodiments are not construed as limited to the illustrated forms and include all changes, equivalents or alternatives within the idea and the technical scope of this disclosure.

The terminology used herein is for the purpose of describing various embodiments only and is not intended to be limiting of the invention. As used herein, the singular forms "a," "an" and "the" are intended to include the plural forms as well, unless the context clearly indicates otherwise. It will be further understood that the terms "include" and/or "have," when used in this specification, specify the presence of stated features, integers, steps, operations, elements, components or combinations thereof, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Like reference numerals in the drawings denote like elements, and redundant descriptions of like elements will be omitted herein. When it is determined a detailed description of a related known function or configuration they may make the purpose of the present invention unnecessarily ambiguous in describing the present invention, the detailed description will be omitted herein.

FIG. 1 illustrates an example of a charge and discharge (charge/discharge) cycle of a battery, in accordance with an embodiment.

A top graph of FIG. 1 shows an example of a change in a voltage of a battery over time in a battery that is fully charged and discharged. In the top graph, a horizontal axis represents time, and a vertical axis represents a voltage of the battery. In FIG. 1, at points in time 111, 112, 113, 114, and 115, the battery is fully charged. At points in time 121, 122, 123, 124, and 125, the battery is fully discharged.

A single cycle associated with charging and discharging of the battery indicates a cycle in which power of a fully charged battery is completely discharged and the battery is fully charged again. For example, a section between the points in time 111 and 112 is a single cycle.

A bottom graph of FIG. 1 shows an example of a change in a capacity based on full charge and discharge of a battery. In the bottom graph, a horizontal axis represents time, and a vertical axis represents a capacity of the battery. Lines 131, 132, 133, 134, and 135 represent capacities of the battery corresponding to the points in time 111 through 115. As shown in the bottom graph, when the battery is fully charged and discharged, the capacity of the battery may be reduced. Batteries are electrochemical devices which convert chemical energy into electrical energy or vice versa through controlled chemical reactions between a set of active chemicals. The desired chemical reactions on which the battery depends are usually accompanied by unwanted, parasitic chemical reactions which consume some of the active chemicals or impede their reactions. Even if the cell's active chemicals remain unaffected over time, cells can fail because unwanted chemical or physical changes to the seals keeping the electrolyte in place.

Chemical reactions internal to the battery are driven either by voltage or temperature. The hotter the battery, the faster chemical reactions will occur. High temperatures can thus provide increased performance, but at the same time the rate of the unwanted chemical reactions will increase resulting in a corresponding loss of battery life. The shelf life and charge retention depend on the self discharge rate and self discharge is the result of an unwanted chemical reaction in the cell. Also, corrosion and gassing are common causes of reduced cycle life. Temperature therefore affects both the shelf life and the cycle life as well as charge retention since they are all due to chemical reactions.

Figure 2:
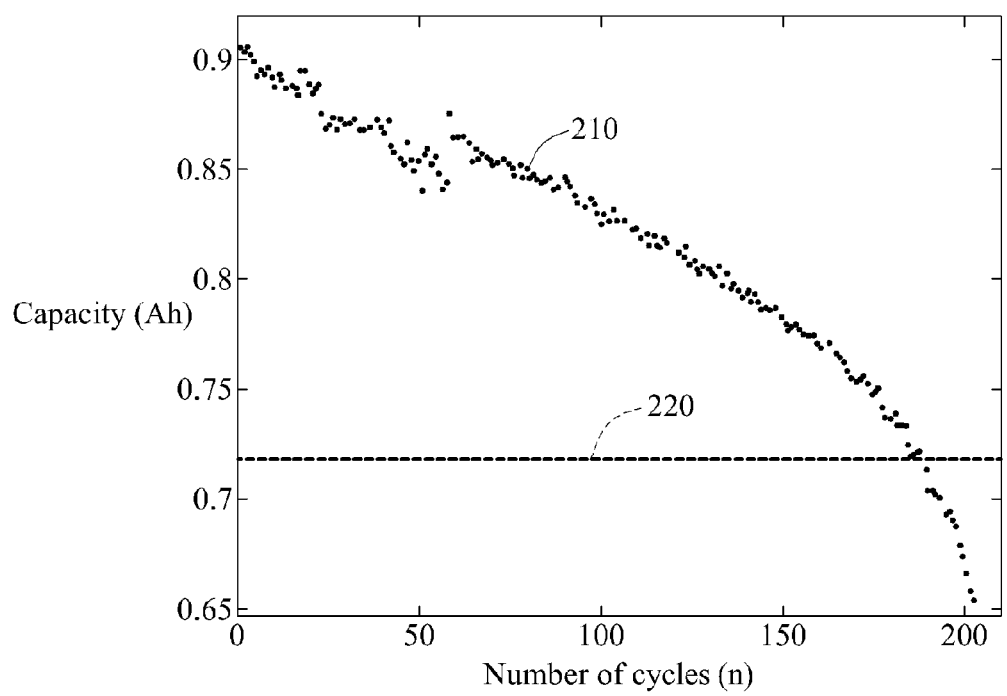
FIG. 2 illustrates an example of a reduction in a life of the battery due to an increase in a number of working cycles of the battery, in accordance with an embodiment.

FIG. 2 illustrates an example of a reduction in a life of a battery due to an increase in a number of working cycles of the battery, in accordance with an embodiment.

Referring to FIG. 2, when a number of cycles in which the battery is charged and discharged increases, the life of the battery is reduced. Thus, the battery has a finite life is due to occurrence of the unwanted chemical or physical changes to, or the loss of, the active materials of which they are made. These changes are usually irreversible and they affect the electrical performance of the cell. The life of the battery refers to a period of time during which the battery normally supplies power to an application. For example, the life of the battery corresponds to a capacity 210 of the battery. The capacity 210 indicates a maximum amount of charge to be stored in the battery. When the capacity 210 is reduced below a threshold 220, the battery needs to be replaced because the battery does not satisfy a power requirement of an application. Accordingly, the life of the battery may have a high correlation with a period of time during which the battery is used, or the use cycle of the battery.

Figure 3:
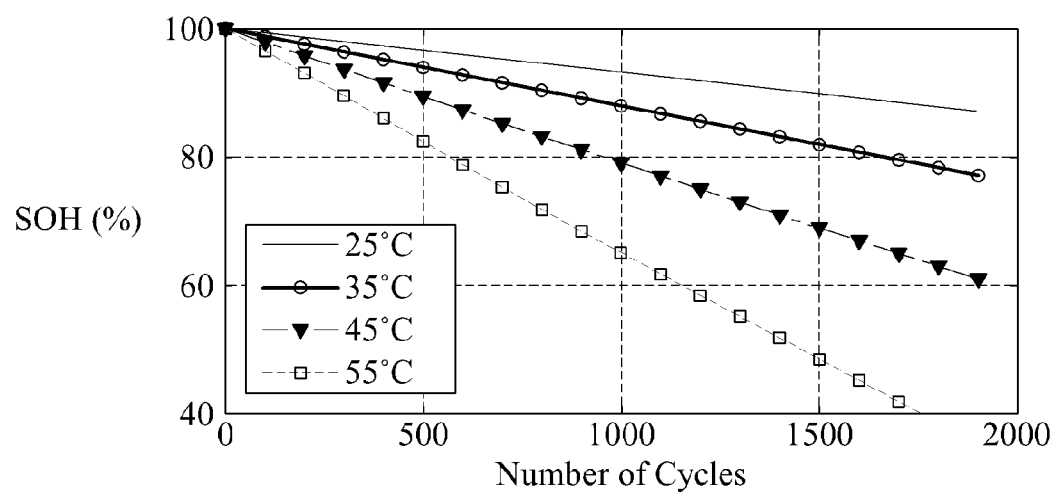
FIG. 3 illustrates an example of a reduction in a life of a battery based on an operating or working temperature of the battery, in accordance with an embodiment.

FIG. 3 illustrates an example of a reduction in a life of a battery based on an operating or working temperature of the battery, in accordance with an embodiment.

The life of the battery may be reduced due to a change in temperature during a cycle in which the battery is charged and discharged. Referring to FIG. 3, typically, the life of the battery rapidly reduces when operating at a higher temperature. For example, when a number of use or working cycles of a battery increases, the life of the battery may be rapidly reduced at 55° C. (131° F.), compared to 25° C. (77° F.). The life of the battery is, for example, a state of health (SOH).

In accordance with an embodiment, the battery life corresponds to, for example, a current capacitance value, an internal resistance value, or an SOH of a battery. The SOH is defined by a ratio of a current capacity and an initial capacity of the battery as shown in the following Equation 1:

$$SOH = \frac{Capacity_{current}}{Capacity_{initial}}. \quad \text{[Equation 1]}$$

Figure 4:
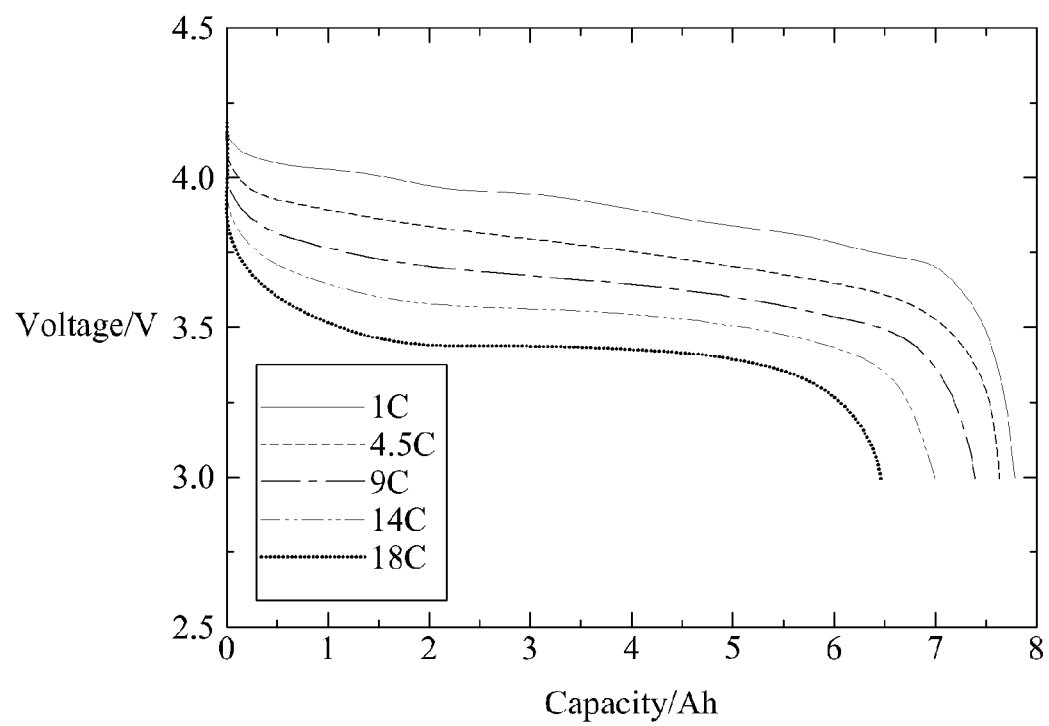
FIG. 4 illustrates an example of a reduction in a life of a battery based on a charge rate (C-rate) thereof.

FIG. 4 illustrates an example of a reduction in a life of a battery based on a charge rate (C-rate), in accordance with an embodiment.

The C-rate indicates a unit, a measure, quantity, or frequency, one measured against some other quantity, unit used to set a current value under various usage or working conditions during charging and discharging of a battery, and to predict or mark a period of time during which the battery is available. For example, the C-rate is denoted as C, and is defined by the following Equation 2:

$$C-\text{rate} = \frac{\text{Charge and discharge current}}{\text{Battery capacity}} \quad \text{[Equation 2]}$$

A graph of FIG. 4 shows an example of a result obtained by performing a life test of a battery at various C-rates. Referring to FIG. 4, typically, when the C-rate increases, the life of the battery is rapidly reduced. The C-rate may be sensed together with a change in a voltage.

Figure 5:
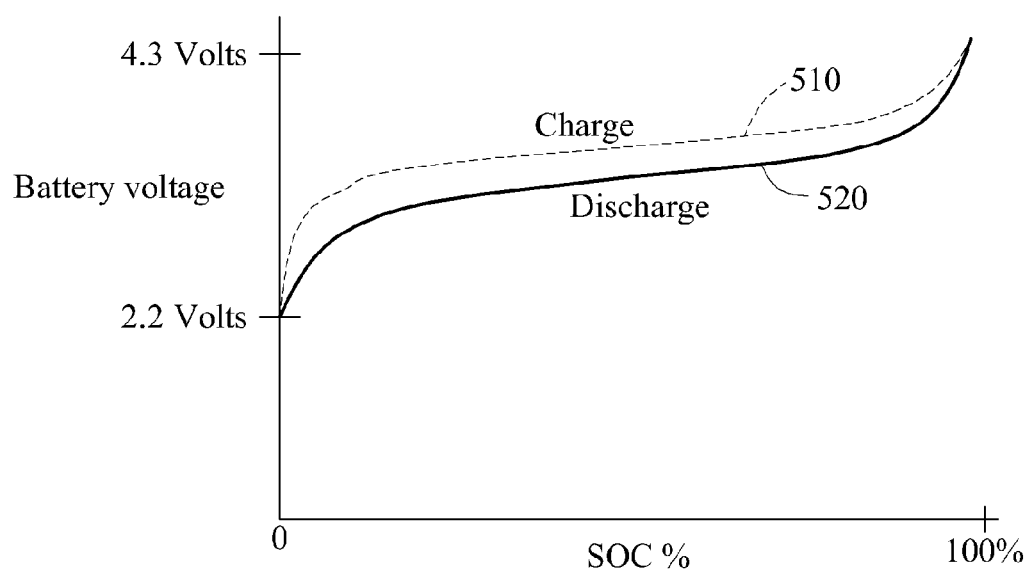
FIG. 5 illustrates an example of a voltage pattern during charging and discharging of the battery, in accordance with an embodiment.

FIG. 5 illustrates an example of a voltage pattern during charging and discharging of a battery, in accordance with an embodiment.

A voltage pattern or a current pattern may change depending on whether the battery is charging or discharging. For example, an influence of the same voltage value or the same current value on a life of the battery is determined based on whether the battery is charged or discharged.

In FIG. 5, a voltage pattern 510 represents charging of the battery, and a voltage pattern 520 represents discharging of the battery. Referring to FIG. 5, different voltage values are sensed depending on whether the battery is being charged or discharged in the same state of charge (SOC).

Figure 6:
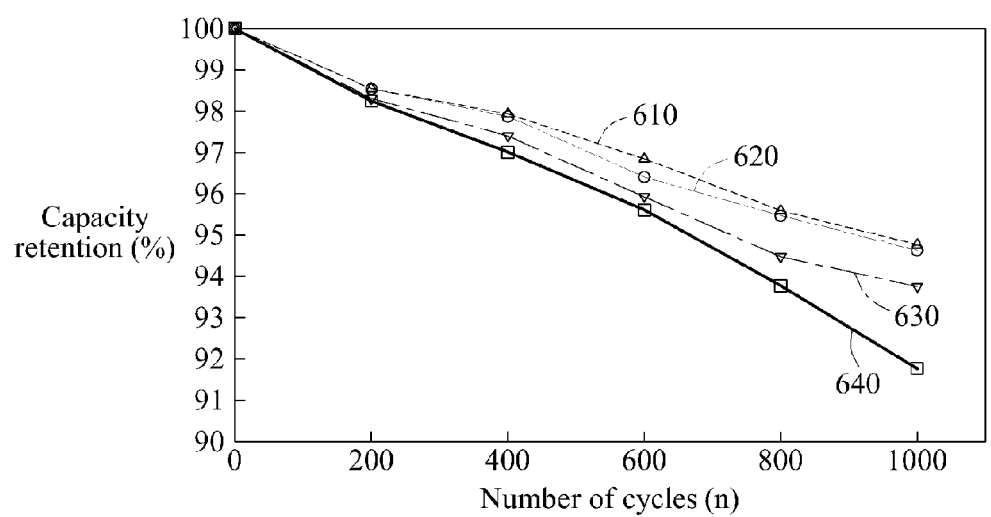
FIGS. 6 through 8 illustrate examples of a reduction in a life of a battery due to use of the battery for each voltage section, in accordance with an embodiment.
Figure 7:
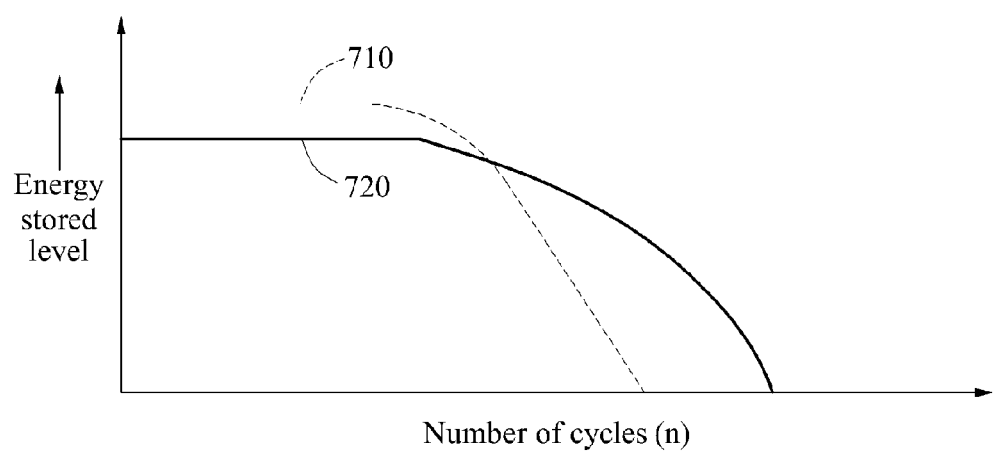
Figure 8:
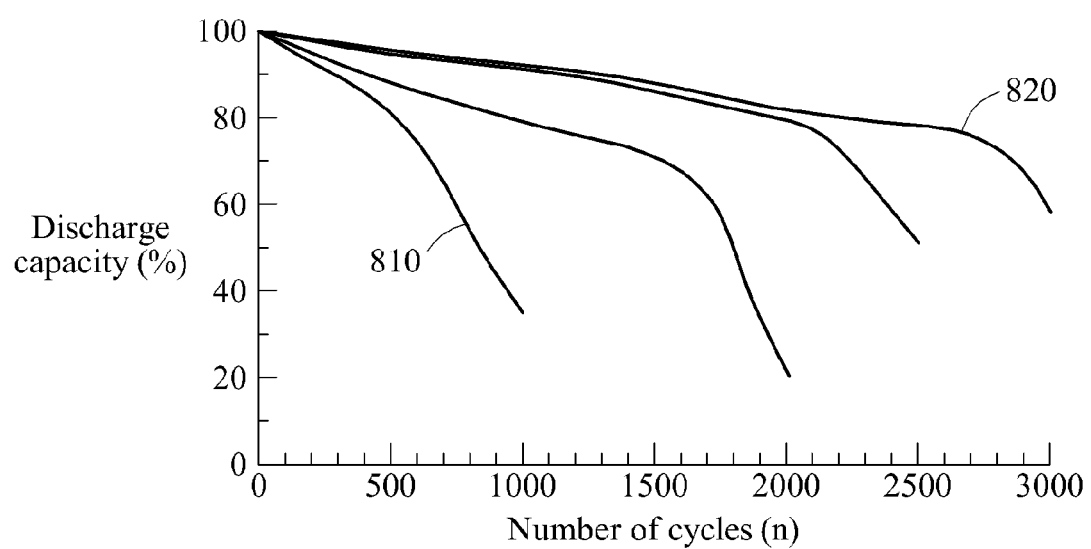

FIGS. 6 through 8 illustrate examples of a reduction in a life of a battery due to use of the battery for each voltage section, in accordance with an embodiment.

FIG. 6 illustrates an example of a battery life 610 corresponding to a battery voltage of 50% to 75%, a battery life 620 corresponding to a battery voltage of 25% to 50%, a battery life 630 corresponding to a battery voltage of 0% to 25%, and a battery life 640 corresponding to a battery voltage of 75% to 100%. As illustrated in FIG. 6, an effect of reduction in the life of the battery changes based on voltage sections of the battery.

FIG. 7 illustrates an example of an energy stored level 710 based on use of a battery in a fully charged state, and an energy stored level 720 based on use of a battery in an 80% charged state. Accordingly, the life of the battery is reduced when the battery is used in a partially charged state, instead of using the battery in a fully charged state.

FIG. 8 illustrates an example of a change in a battery life due to a change in a cut-off voltage. The cut-off voltage refers to a voltage at which charging or discharging is terminated. FIG. 8 illustrates a degree that a discharge capacity 820 is reduced when the cut-off voltage is adjusted to be less than a degree of a discharge capacity 810 that is reduced when the cut-off voltage is not adjusted.

In an electric vehicle (EV), a state of a battery, that is, a life of the battery (for example, an SOH) may need to be accurately estimated. The life of the battery is an important item associated with a safety accident and a traveling distance of the EV and, accordingly, a battery control apparatus of the EV is needed to estimate the life of the battery. In an embodiment, the battery control apparatus is a battery management system (BMS).

In the following description, a battery system includes a battery and a battery control apparatus. The battery supplies power to a driving vehicle (for example, an EV) equipped with a battery system, and includes a plurality of battery modules. Each of the battery modules includes a plurality of cells. The battery modules are operatively connected or, in the alternative, directly connected to each other in parallel, in series, or in both parallel and series. In an example, the battery modules are secondary batteries, for example, lithium ion batteries. Capacities of the battery modules may be the same as or different from each other. The battery system may be an energy storage system (ESS).

The battery control apparatus monitors a state of the battery, and controls the battery. The battery control apparatus performs thermal control of the battery modules in the battery. In addition, the battery control apparatus prevents overcharge and overdischarge of the battery, and controls the battery modules to be in equal charge states by performing cell balancing. Accordingly, an energy efficiency of the battery increases, and the life of the battery is extended.

The battery control apparatus provides or outputs life information, charge information, or function information to an electronic control unit (ECU). For example, the battery control apparatus communicates with the ECU using a controller area network (CAN) communication.

Figure 9:
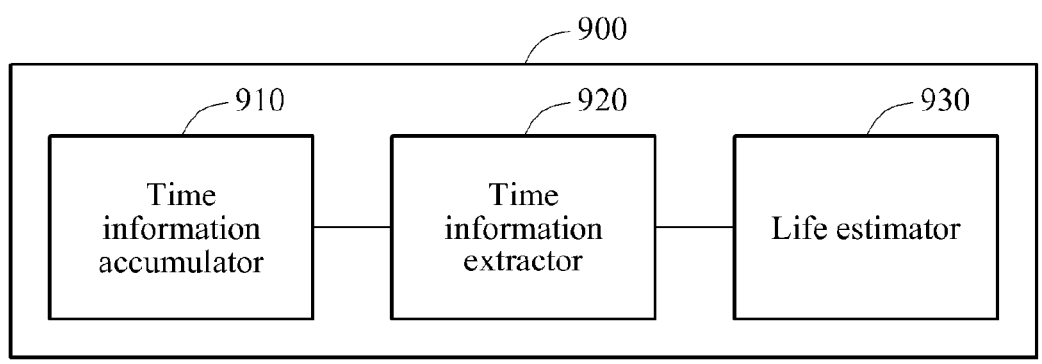
FIG. 9 illustrates an example of a battery life estimation apparatus, in accordance with an embodiment.

FIG. 9 illustrates an example of a battery life estimation apparatus 900, in accordance with an embodiment.

Referring to FIG. 9, the battery life estimation apparatus 900 includes a time information accumulator 910, a time information extractor 920, and a life estimator 930.

The battery life estimation apparatus 900 estimates a state of a battery used as an energy source of an EV. The state of the battery includes an end of life (EOL), or life information, for example, a state of health (SOH). Exact state information of EVs is provided to EV drivers by accurately estimating an SOH or an EOL and, accordingly, a negative feeling about Evs compared to gasoline powered vehicles is alleviated. Additionally, the battery life estimation apparatus 900 is lightened in weight, and is mounted in a battery control apparatus (for example, a BMS). Furthermore, the battery life estimation apparatus 900 reduces a time required to estimate a state of a battery. The battery life estimation apparatus 900 may be applicable to electronic devices or apparatuses, such as mobile devices, tablets, Bluetooth devices, and recorders, employing batteries, in addition to EVs.

The time information accumulator 910 partitions sensing data of a battery into predetermined sections, and accumulates time information corresponding to the sections. The time information accumulator 910 includes at least one of a voltage sensor, a current sensor, and a temperature sensor to measure at least one of a voltage signal, a current signal, and a temperature signal, respectively, of the battery in real time.

The time information accumulator 910 partitions acquired sensing data into the sections in a predetermined range. For example, the time information accumulator 910 partitions voltage data extracted from the measured voltage signal into sections of 0.2 volt (V), and partitions current data extracted from the measured current signal into sections of 1 ampere (A). Additionally, the time information accumulator 910 partitions temperature data extracted from the measured temperature signal into sections of 0.5° C.

The time information accumulator 910 accumulates time information for a period of time during which the battery is used for each of the sections.

Additionally, the time information accumulator 910 stores the accumulated time information. For example, the time information accumulator 910 stores the accumulated time information in the form of a vector.

In an example, the battery life estimation apparatus 900 further includes a charge/discharge determiner (not illustrated). Based on a measured current signal of a battery, the charge/discharge determiner determines whether the battery is being charged or discharged.

The time information extractor 920 extracts time information corresponding to at least one period from the accumulated time information. The at least one period is set or defined in advance, or set or defined by the time information extractor 920. In one configuration, the time information extractor 920 sets the at least one period based on a usage history of the battery. In an example, when a pattern in which a battery usage is relatively high for five days and is relatively low for two days, is repeated, the time information extractor 920 defines or sets a period of a week as the at least one period. In another example, when a battery usage is determined based on a quarter or season of a year, the time information extractor 920 sets a period of a quarter or a season as the at least one period. In still another example, the time information extractor 920 receives information on the at least one period from an external apparatus (for example, a server) using a communication interface.

The time information extractor 920 stores the accumulated time information based on the at least one period. The time information extractor 920 stores the accumulated time information, for example, every day, every week, every month, or every year. For example, when a battery is used for two years, the time information extractor 920 extracts 730 pieces of time information corresponding to a period of a day, 104 pieces of time information corresponding to a period of a week, 24 pieces of time information corresponding to a period of a month, and two pieces of time information corresponding to a period of a year.

In an example, the time information extractor 920 extracts time information corresponding to at least one period in the form of an input vector.

In an example, when a battery is frequently used, the life of the battery decreases. Accordingly, the reduction in the life of the battery correlates to a usage history of the battery. For example, the time information accumulator 910 partitions sensing data of a battery into sections in a predetermined range for each of a voltage, a current, and a temperature, and accumulates time information during a period of time during which the battery is used in each of the sections. The life estimator 930 estimates a life of the battery corresponding to a usage history of the battery.

A learner uses the accumulated time information as learning information. In this example, the learning information refers to information learned by the learner from the usage history of the battery. For example, the learner includes a black-box function. When an input and output of the black-box function are given, the learner may learn a parameter of the black-box function to generate an output corresponding to the input. The learning information includes, for example, a parameter or a type of the learner. The learner includes, for example, one of a neural network, a hidden Markov model (HMM), a Bayesian network, a support vector machine (SVM), and a decision tree (DT). In an example, the life estimator 930 receives the learning information from an external apparatus, using a communication interface, and inputs the received learning information to the learner. In this example, the external apparatus includes, for example, electronic apparatuses or processors other than the battery life estimation apparatus 900.

In accordance with an embodiment, the life estimator 930 extracts expected time information by predicting a change in the accumulated time information due to battery use, and estimates an EOL of the battery based on the expected time information. The expected time information refers to time information expected in the future.

In accordance with a further embodiment, the life estimator 930 extracts expected time information based on the accumulated time information, the time information corresponding to the at least one period, and predetermined learning information. In an example, the life estimator 930 adds time information corresponding to each of the at least one period to the accumulated time information in an order of a longest period to a shortest period among the at least one period, and extracts the expected time information. In this example, when a plurality of pieces of time information correspond to each of the at least one period, based on time information corresponding to recently sensed sensing data among the pieces of time information, the life estimator 930 extracts the expected time information. The life estimator 930 sets the accumulated time information as initial expected time information, and updates the expected time information by adding the time information corresponding to each of the at least one period to the initial expected time information. Each time the expected time information is updated, the life estimator 930 predicts the life of the battery based on the updated expected time information and the predetermined learning information, and updates, for each of the at least one period, the expected time information by adding the time information corresponding to each of the at least one period to the expected time information until the predicted life of the battery does not end. For example, when time information corresponding to an n-th period is added to the expected time information, the life estimator 930 adds the time information corresponding to the n-th period to the expected time information, to which time information corresponding to each of a first period as a longest period through an (n−1)-th period is added, until the predicted life of the battery does not end. In this example, the life estimator 930 estimates a capacity of the battery based on the updated expected time information and the predetermined learning information. When the estimated capacity of the battery is less than 0.8 times an initial capacity of the battery, the life estimator 930 determines that the life of the battery has ended. The life estimator 930 adds-up periods of time corresponding to the time information added to the initial expected time information in the extracted expected time information, and extracts the added periods of time as the EOL of the battery.

The life estimator 930 reduces a dimension of an input vector corresponding to the expected time information. When the dimension of the input vector is reduced, a time required to estimate the capacity of the battery by the life estimator 930 is reduced. For example, the life estimator 930 minimizes a loss of information caused by a reduction in the dimension of the input vector using a principal component analysis (PCA), a linear discriminant analysis (LDA), or any other suitable technique known to one of ordinary skill in the art. The life estimator 930 estimates the capacity of the battery by inputting, to the learner, the input vector with the transformed dimension and the predetermined learning information. In one example, the life estimator 930 receives the predetermined learning information from an external apparatus.

For example, when the time information extractor 920 extracts time information corresponding to a year, a month, and a week, the life estimator 930 sets accumulated time information as initial expected time information, sets an additional period to "1," adds time information corresponding to a year to the initial expected time information, and updates the expected time information. The life estimator 930 estimates the capacity of the battery based on the updated expected time information. When the estimated life of the battery is equal to or greater than 0.8 times an initial capacity of the battery, the life estimator 930 sets an additional period to "3," adds time information corresponding to a year to the expected time information, and updates the expected time information. When the estimated capacity is less than 0.8 times the initial capacity, the life estimator 930 extracts expected time information corresponding to an additional period of "2" as expected time information corresponding to a period of a year. Accordingly, the life estimator 930 extracts a remaining life of the battery corresponding to a period of a year to be two years.

Furthermore, the life estimator 930 may repeatedly update the expected time information and estimate the capacity of the battery, every month and every day. When an additional period of "5" is added to the expected time information corresponding to a period of a month, the life estimator 930 extracts a remaining life of the battery corresponding to a period of a month to be five months. When an additional period of "3" is added to the expected time information corresponding to a period of a day, the life estimator 930 extracts a remaining life of the battery corresponding to a period of a day to be three days. Time information corresponding to two years, time information corresponding to five months, and time information corresponding to three days are added to the initial expected time information. As a result, the life estimator 930 estimates the EOL of the battery, which indicates that the life of the battery is to end after two years, five months, and three days from a current time.

Figure 10:
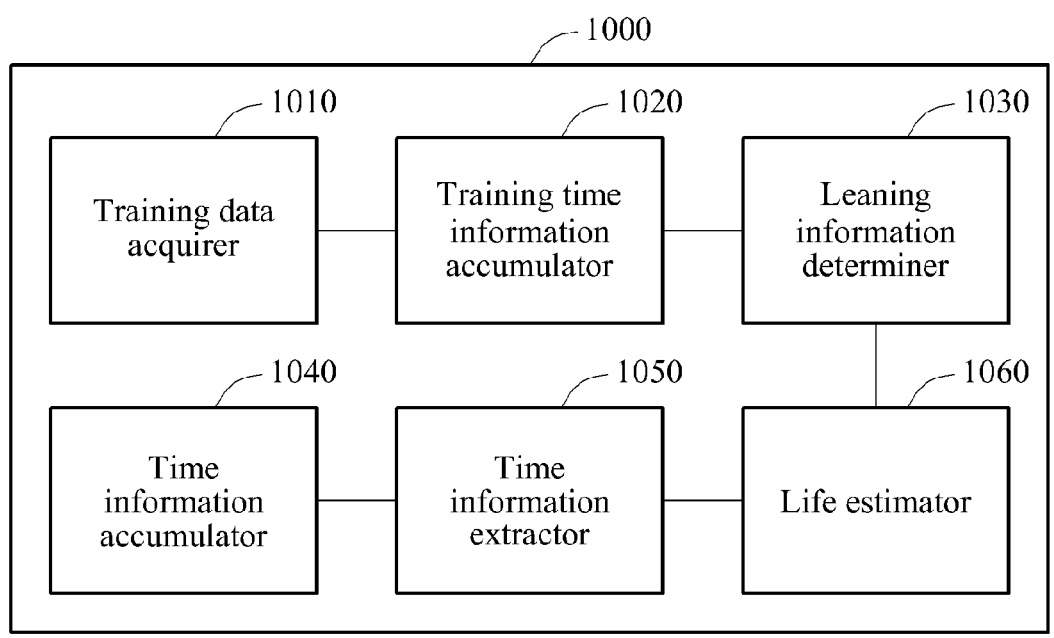
FIG. 10 illustrates another example of a battery life estimation apparatus, in accordance with an embodiment.

FIG. 10 illustrates an example of a battery life estimation apparatus 1000, in accordance with an embodiment.

Referring to FIG. 10, the battery life estimation apparatus 1000 includes a training data acquirer 1010, a training time information accumulator 1020, a learning information determiner 1030, a time information accumulator 1040, a time information extractor 1050, and a life estimator 1060.

The training data acquirer 1010 acquires training data of a battery. In an example, the training data acquirer 1010 acquires training data of a single battery, or training data of a plurality of batteries. In another example, the training data acquirer 1010 measures at least one of a voltage signal, a current signal, and a temperature signal of the battery in real time, and acquires training data. In still another example, the training data acquirer 1010 collects sample battery information from pre-stored battery data. The sample battery information refers to a portion of pre-stored data, and corresponds to data acquired by simulating driving information of a vehicle. The driving information includes, for example, an urban dynamometer driving schedule (UDDS) profile.

In accordance with an embodiment, the training time information accumulator 1020 partitions the training data into predetermined sections. The training time information accumulator 1020 accumulates time information during a period of time that the battery is used, in each of the sections into which the training data is partitioned. Additionally, the training time information accumulator 1020 stores accumulated training time information.

The training time information accumulator 1020 transforms accumulated training time information to an input vector.

The training time information accumulator 1020 reduces a dimension of the input vector corresponding to the accumulated training time information. When the dimension of the input vector is reduced, a time required to determine learning information is reduced. The training time information accumulator 1020 uses, for example, a PCA, an LDA, and other similar applications, to reduce the dimension of the input vector.

In an example, the battery life estimation apparatus 1000 further includes a charge/discharge determiner (not illustrated). The charge/discharge determiner determines, based on the measured current signal, whether the battery is being charged or discharged.

The learning information determiner 1030 determines learning information based on reference information and the accumulated training time information. The learning information is used to estimate an EOL of the battery. The reference information is state information used as a criterion to estimate the EOL of the battery, and includes, for example, an actual life or a life of the battery extracted from pre-stored battery data. The actual life is, for example, a life of a battery measured directly by the battery using an electrochemical impedance spectroscopy (EIS), or other suitable techniques known to one of ordinary skill in the art.

The learning information determiner 1030 inputs the reference information and the accumulated training time information to a learner (not shown). Based on the reference information and the accumulated training time information, the learner learns an optimum parameter corresponding to the learning information. For example, the learner learns a parameter optimized for a learning model used in the learner, based on the input vector corresponding to the accumulated training time information and the reference information. The parameter includes, for example, state information of the battery. The learner includes, for example, at least one of a neural network, an HMM, a Bayesian network, an SVM, and a DT. The learning information determiner 1030 stores a determined parameter. The parameter stored in the learning information determiner 1030 is used to estimate the EOL of the battery. The learning information determiner 1030 transmits the determined learning information to an external apparatus using a communication interface.

In an embodiment, the training data acquirer 1010, the training time information accumulator 1020 and the learning information determiner 1030 are external apparatuses to the battery life estimation apparatus 1000. In this embodiment, the battery life estimation apparatus 1000 would communicate with the learning information determiner 1030 and received the determined learning information to estimate an EOL of the battery. The training data acquirer 1010, the training time information accumulator 1020 and the learning information determiner 103, for example, would be included in a preprocessing apparatus to estimate the EOL of the battery.

The time information accumulator 1040 partitions sensing data of the battery into predetermined sections, and accumulates time information corresponding to the sections into which the sensing data is partitioned.

The time information extractor 1050 extracts time information corresponding to at least one period from the accumulated time information.

The life estimator 1060 extracts expected time information by predicting a change in the accumulated time information due to battery use, based on the accumulated time information, the time information corresponding to the at least one period, and the learning information determined by the learning information determiner 1030. The life estimator 1060 estimates the EOL of the battery based on the extracted expected time information.

The description of the time information accumulator 910, the time information extractor 920 and the life estimator 930 of FIG. 9 is equally applicable to the time information accumulator 1040, the time information extractor 1050 and the life estimator 1060, respectively, of FIG. 10 and, accordingly, will not be repeated here.

Figure 11:
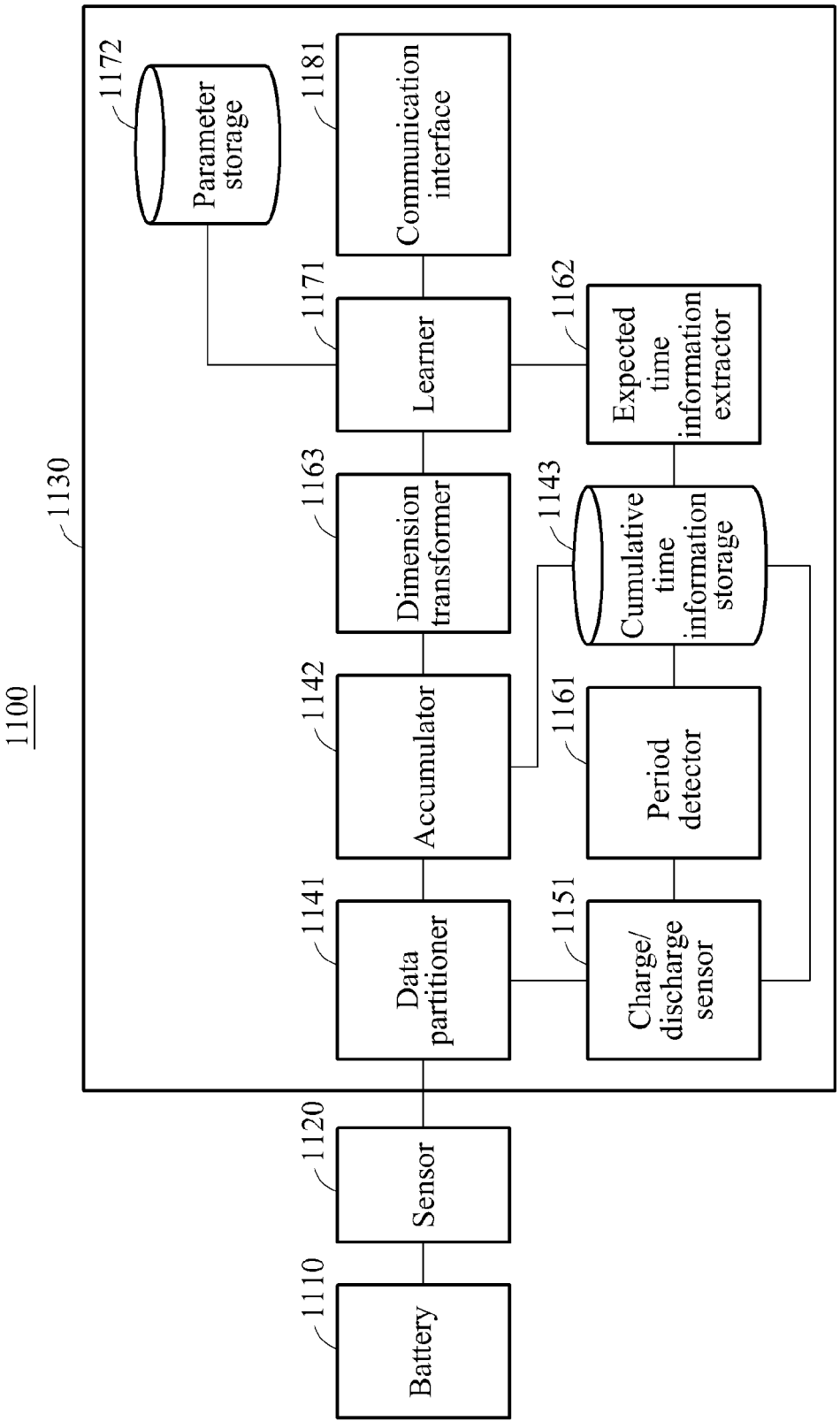
FIG. 11 illustrates an example of a battery system, in accordance with an embodiment.

FIG. 11 illustrates an example of a battery system 1100, in accordance with an embodiment.

Referring to FIG. 11, the battery system 1100 includes a battery 1110, a sensor 1120, and a battery control apparatus 1130. The sensor 1120 is disposed outside the battery control apparatus 1130, as shown in FIG. 11. However, in alternative configurations, the sensor 1120 is disposed in the battery control apparatus 1130 or may be an integral part of the battery 1110. In one configuration, a driving vehicle, such as an EV, or an electronic device includes the battery 1110.

The battery 1110 supplies power to the driving vehicle or the electronic device. The battery 1110 includes one battery module or a plurality of battery modules. Capacities of the battery modules may be the same as or different from each other.

The sensor 1120 acquires sensing data of the battery 1110. The sensor 1120 includes at least one of a voltage sensor, a current sensor and a temperature sensor. Accordingly, the sensor 1120 measures at least one of a voltage signal, a current signal, and a temperature signal of the battery modules in the battery 1110 in real time.

The battery control apparatus 1130 includes a data partitioner 1141, an accumulator 1142, a cumulative time information storage 1143, a charge/discharge sensor 1151, a period detector 1161, an expected time information extractor 1162, a dimension transformer 1163, a learner 1171, a parameter storage 1172, and a communication interface 1181.

The data partitioner 1141 acquires the sensing data from the sensor 1120 of the battery 1110. The sensing data includes, for example, a voltage signal, a current signal, and a temperature signal of the battery 1110 measured by the sensor 1120. The data partitioner 1141 partitions the sensing data into predetermined sections. For example, the data partitioner 1141 partitions voltage data extracted from the measured voltage signal into sections of 0.2 V, partitions current data extracted from the measured current signal into sections of 1 A, and partitions temperature data extracted from the measured temperature signal into sections of 0.5° C. (32.9° F.).

The accumulator 1142 receives the partitioned sensing data from the data partitioner 1141, and accumulates time information corresponding to the sections into which the sensing data is partitioned. For example, when the battery 1110 is used for one hour, the accumulator 1142 extracts from the sensing data partitioned into sections of 0.2 V, time information of 10 minutes accumulated in a section between 3.4 V and 3.6 V, time information of 30 minutes accumulated in a section between 3.6 V and 3.8 V, time information of 5 minutes accumulated in a section between 3.8 V and 4.0 V, and time information of 15 minutes accumulated in a section between 4.0 V and 4.2 V.

The accumulator 1142 stores the accumulated time information in the cumulative time information storage 1143.

The charge/discharge sensor 1151 determines, based on the measured current signal of the battery 1110, whether the battery 1110 is being charged or discharged.

The period detector 1161 detects at least one period required to estimate an EOL of the battery 1110. In one embodiment, the period detector 1161 detects the at least one period from pre-stored information. For example, the period detector 1161 detects a period of a week, a period of a month, a period of a quarter, and a period of a year from the pre-stored information. Based on a usage history of the battery 1110, the period detector 1161 also detects at least one period. For example, when a battery use pattern is changed every two weeks, every three months, and every six months based on a usage history for the last one year, the period detector 1161 detects two weeks, three months, and six months as at least one period.

The expected time information extractor 1162 extracts expected time information by predicting a change in the accumulated time information due to use of the battery 1110.

The expected time information extractor 1162 extracts the expected time information corresponding to the at least one period detected at the period detector 1161 from the accumulated time information stored in the cumulative time information storage 1143. For example, the expected time information extractor 1162 extracts, from the accumulated time information, time information corresponding to a period of a week, time information corresponding to a period of a month, and time information corresponding to a period of a year. Additionally, the expected time information extractor 1162 adds time information, corresponding to each of the at least one period, to the accumulated time information in an order of a longest period to a shortest period among the at least one period, and extracts the expected time information. The expected time information extractor 1162 sets the accumulated time information as initial expected time information, adds the time information corresponding to each of the at least one period to the initial expected time information, and updates the expected time information.

Every time the expected time information is updated, the dimension transformer 1163 transforms an input vector corresponding to the updated expected time information to reduce a dimension of the input vector. The dimension transformer 1163 uses, for example, a PCA or an LDA, to transform the input vector.

The learner 1171 receives, as an input, the input vector transformed by the dimension transformer 1163. Based on a parameter corresponding to predetermined learning information, the learner 1171 estimates a capacity of the battery 1110 corresponding to the expected time information updated at the expected time information extractor 1162. The learner 1171 receives the predetermined learning information from the parameter storage 1172. The learner includes, for example, one of a neural network, an HMM, a Bayesian network, an SVM, and a DT.

The parameter storage 1172 receives the predetermined learning information from an external apparatus using the communication interface 1181. In an example, based on training data and reference information, the learner 1171 learns, in advance, an optimum parameter corresponding to learning information and stores the learned parameter in the parameter storage 1172. In one embodiment, the reference information is state information used as a criterion to estimate an EOL of a battery, and includes, for example, an actual life or a life of the battery extracted from pre-stored battery data. The parameter storage 1172 provides the stored parameter to the learner 1171.

The expected time information extractor 1162 predicts the capacity of the battery 1110 using the dimension transformer 1163 and the learner 1171. The expected time information extractor 1162 predicts the capacity of the battery 1110 every time the expected time information is updated. The expected time information extractor 1162 predicts the capacity of the battery 1110 by adding time information corresponding to each of the at least one period to the expected time information in the order of the longest period to the shortest period. The expected time information extractor 1162 updates, for each of the at least one period, the expected time information by adding time information, corresponding to each of the at least one period, to the expected time information, until the predicted capacity becomes less than a predetermined amount, such as 0.8 times, of an initial capacity of the battery 1110. For example, when time information corresponding to a period of a day is added three times to the expected time information, the predicted capacity is 0.81 times the initial capacity. Additionally, when the time information corresponding to the period of a day is added four times to the expected time information, the predicted capacity is 0.79 times the initial capacity. In this example, the expected time information extractor 1162 adds three times the time information corresponding to the period of a day to the expected time information, and updates the expected time information.

Additionally, the expected time information extractor 1162 adds up periods of time corresponding to time information added to the time information accumulated by the accumulator 1142, and extracts the EOL of the battery 1110. For example, when time information corresponding to a period of a year is added three times to the accumulated time information, when time information corresponding to a period of a month is added four times to the accumulated time information, and when time information corresponding to a period of a day is added three times to the accumulated time information, the expected time information extractor 1162 extracts the EOL of the battery 1110. The EOL indicates that the life of the battery 1110 is to end after three years, four months, and three days from a current time.

The expected time information extractor 1162 transmits the extracted EOL of the battery 1110 to an external apparatus.

Figure 12:
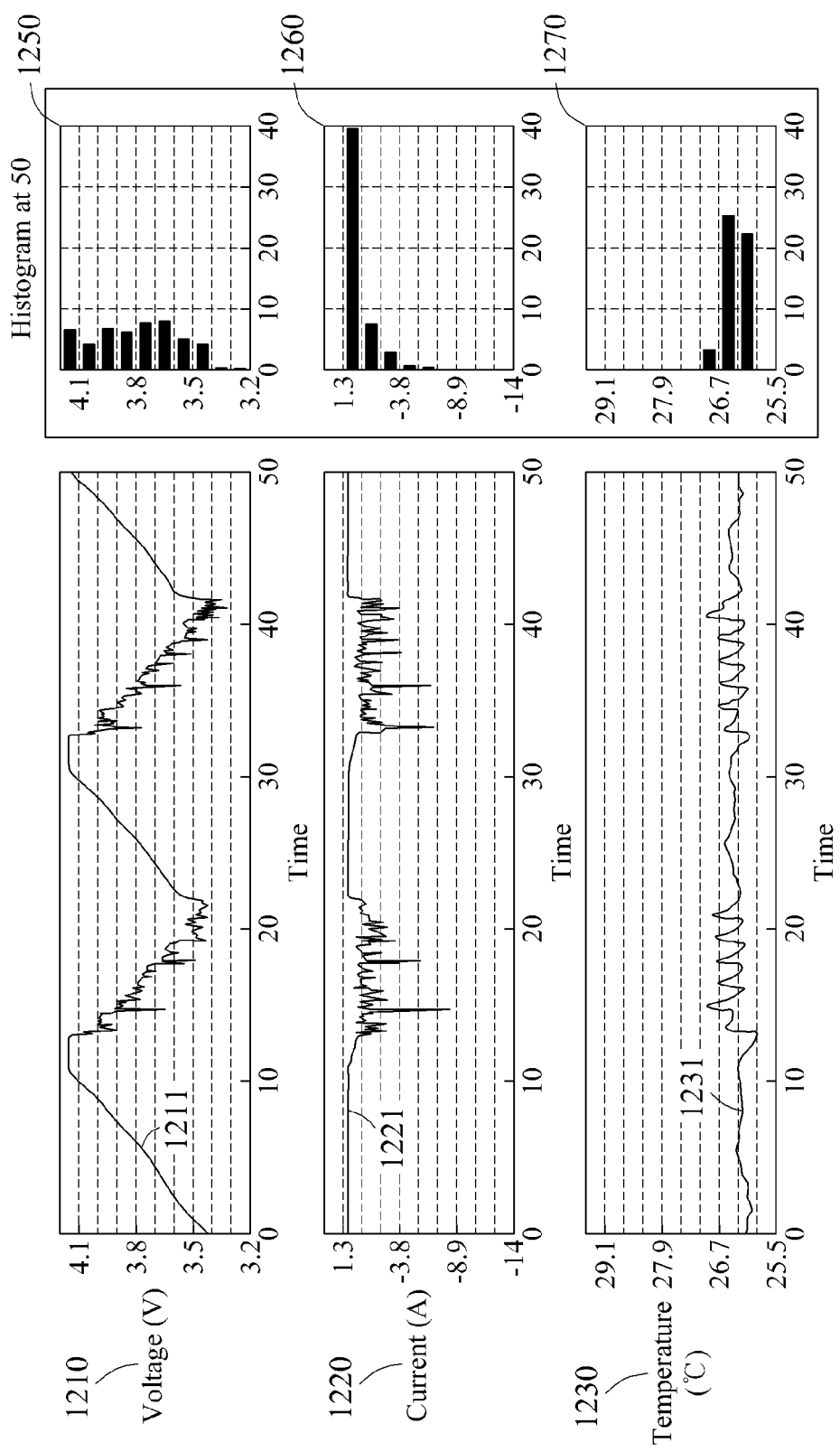
FIG. 12 illustrates an example of a partition to sense data into sections and accumulation of time information corresponding to the sections, in accordance with an embodiment.

FIG. 12 illustrates an example of partition of sensing data into sections and accumulation of time information corresponding to the sections, in accordance with an embodiment.

In FIG. 12, graphs 1210, 1220, and 1230 show voltage data 1211, current data 1221, and temperature data 1231, respectively acquired by sensing a battery for 50 minutes. In the graphs 1210, 1220, and 1230, horizontal axes represent time, and vertical axes represent a voltage, a current, and a temperature. A battery life estimation apparatus partitions each of the voltage data 1211, the current data 1221, and the temperature data 1231 into predetermined sections. As shown in FIG. 12, the battery life estimation apparatus partitions the voltage data 1211 into sections of 0.1 V, partitions the current data 1221 into sections of 1.7 A, and partitions the temperature data 1231 into sections of 0.4° C.

The battery life estimation apparatus accumulates time information corresponding to the sections. The battery life estimation apparatus generates histograms 1250, 1260, and 1270 that represent accumulated time information based on the sections of the voltage data 1211, the current data 1221, and the temperature data 1231, respectively.

In the graph 1210, the voltage data 1211 is repeated in a range of 3.4 V to 4.2 V. In the histogram 1250 of the voltage data 1211, accumulated time information corresponding to eight sections in the range of 3.4 V to 4.2 V are similar to each other.

In the graph 1220, the current data 1221 has current values in a range of −0.4 A to 1.3 A for most of the time. In the histogram 1260 of the current data 1221, a largest quantity of time information is accumulated in sections in the range of −0.4 A to 1.3 A.

In the graph 1230, the temperature data 1231 has temperature values in a range of 25.9° C. to 26.7° C. for most of the time. In the histogram 1270 of the temperature data 1231, a relatively large quantity of time information is accumulated in sections in a range of 25.9° C. to 26.3° C. and sections in a range of 26.3° C. to 26.7° C.

FIG. 13 illustrates an example of time information corresponding to at least one period, in accordance with an embodiment.

A table of FIG. 13 shows time information corresponding to at least one period. In the table, columns represent a day, a week, a month, six months, and a year, and rows represent voltage sections, current sections, and temperature sections. In the table, V1, V2 and Vn represent, for example, sections in a range of 4.1 V to 4.2 V, sections in a range of 4.0 V to 4.1V, and sections in a range of 3.2 V to 3.3 V, respectively.

A battery life estimation apparatus, in accordance with an embodiment, partitions sensing data of a battery into predetermined sections, accumulates time information corresponding to the sections, and extracts time information corresponding to at least one period from the accumulated time information. For example, the battery life estimation apparatus stores the table of FIG. 13 in the form of an input vector. The battery life estimation apparatus extracts expected time information by predicting a change in the accumulated time information due to use of the battery, based on the accumulated time information, time information corresponding to at least one period as shown in FIG. 13, and predetermined learning information. The battery life estimation apparatus estimates an EOL of the battery based on the expected time information.

Figure 14A:
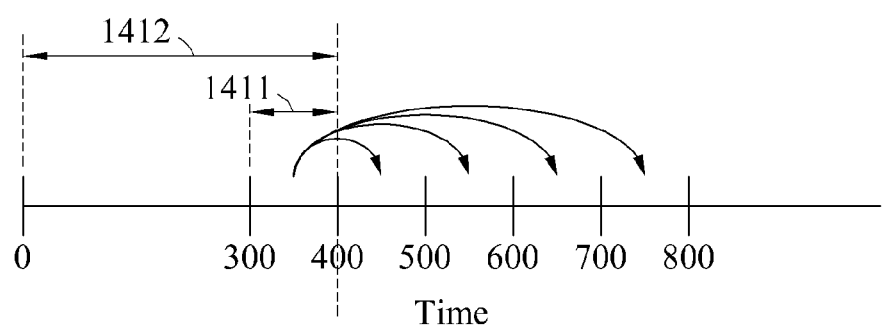
FIGS. 14A and 14B illustrate an example of estimation of a life of a battery, in accordance with an embodiment.
Figure 14B:
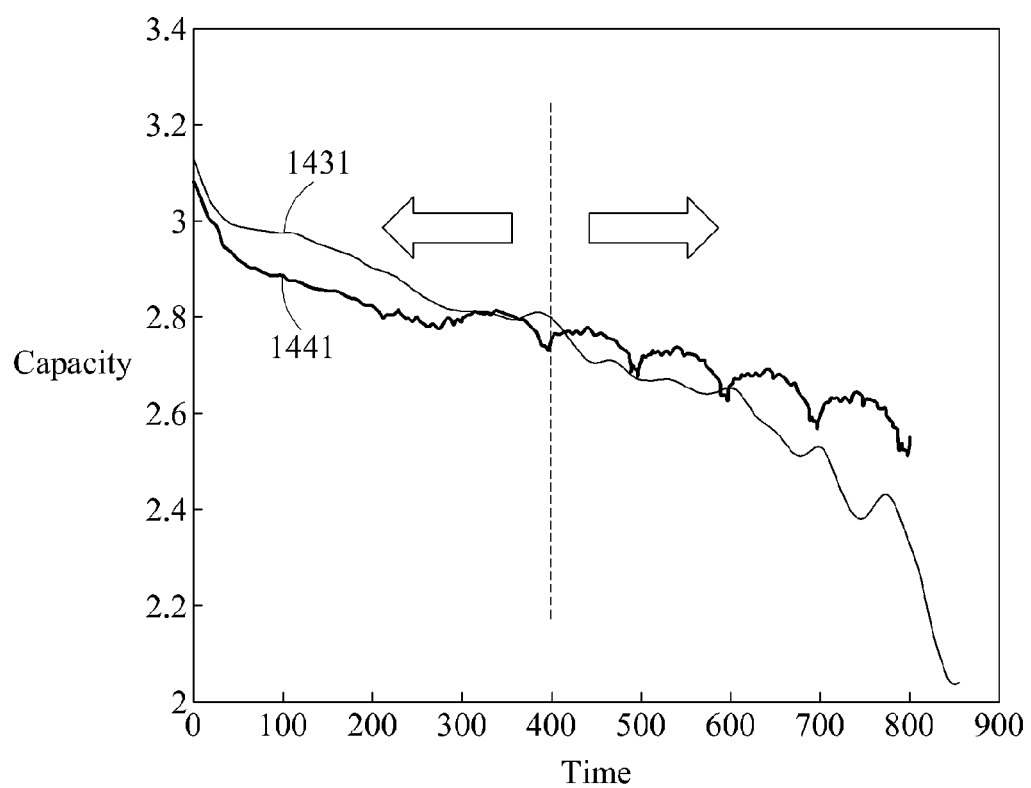

FIGS. 14A and 14B illustrate an example of estimation of a life of a battery, in accordance with an embodiment.

A graph of FIG. 14A shows an example of time information corresponding to a period of 100 hours, and expected time information. In the graph of FIG. 14A, a horizontal axis represents time.

A battery life estimation apparatus partitions sensing data of a battery into predetermined sections, accumulates time information corresponding to the sections, and extracts time information 1411 corresponding to the period of 100 hours from accumulated time information 1412.

The battery life estimation apparatus adds the time information 1411 to the accumulated time information 1412, and updates expected time information. Every time the expected time information is updated, the battery life estimation apparatus estimates a capacity of the battery by inputting the updated expected time information and predetermined learning information to a learner. The battery life estimation apparatus updates the expected time information by adding the time information 1411 to the expected time information before the estimated capacity becomes less than 0.8 times an initial capacity of the battery. In FIG. 14A, the battery life estimation apparatus adds four times the time information 1411 to the accumulated time information 1412, and generates expected time information.

A graph of FIG. 14B shows an example of a capacity of a battery estimated based on an update of an expected time interval. In the graph of FIG. 14B, a horizontal axis represents time and a vertical axis represents the capacity of the battery. As described above, the battery life estimation apparatus estimates the capacity of the battery every time an expected time interval is updated. The expected time interval is updated by adding the time information 1411 of FIG. 14A. As a result, an estimated capacity 1441 of the battery tends to be similar to an actual capacity 1431 of the battery, as shown in FIG. 14B.

Figure 15:
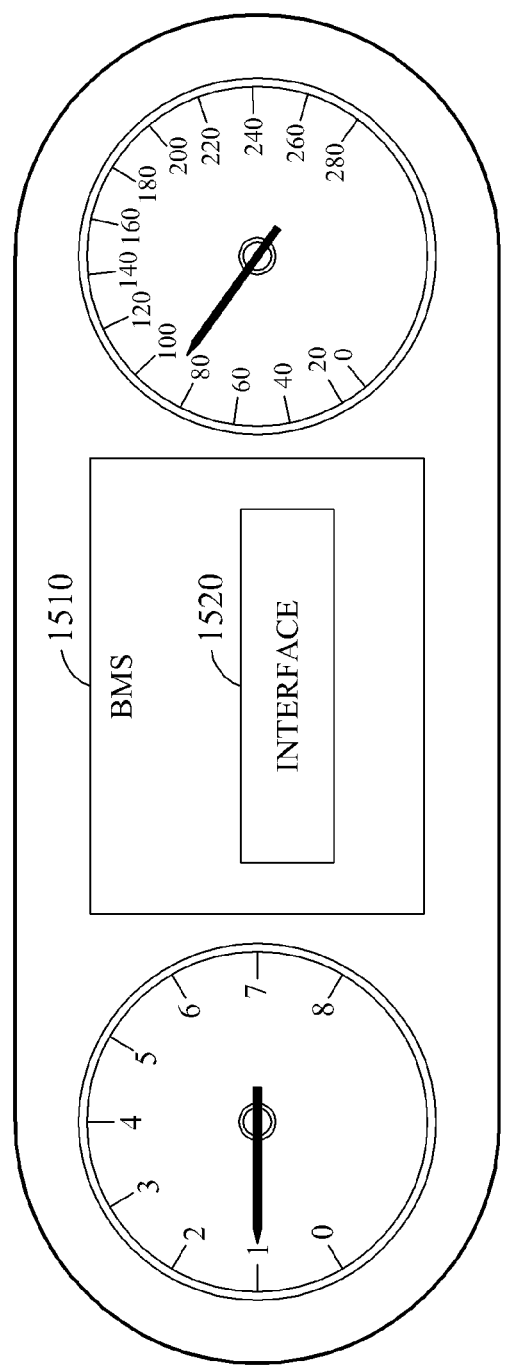
FIG. 15 illustrates an example of a user interface, in accordance with an embodiment.

FIG. 15 illustrates an example of a user interface, in accordance with an embodiment.

Referring to FIG. 15, a battery control apparatus receives a trigger signal from an external apparatus, and acquires sensing data of a battery in response to the received trigger signal. When the battery is being partially charged or discharged, the battery control apparatus estimates an EOL of the battery in real time. For example, when an ignition of an EV including the battery and the battery control apparatus is turned on, an ECU displays a user interface 1510 including a battery management system (BMS) on a dashboard. The user interface 1510 includes an interface 1520 configured to receive a request from a user to verify battery life information and, in response, generate a trigger signal. When a user selects the interface 1520, the ECU transmits a trigger signal to the battery control apparatus. The battery control apparatus partitions sensing data of the battery into predetermined sections, accumulates time information corresponding to the predetermined sections, and extracts time information corresponding to at least one period from the accumulated time information. Additionally, the battery control apparatus extracts expected time information by predicting a change in the accumulated time information due to the battery use, based on the accumulated time information, the time information corresponding to the at least one period, and predetermined learning information. The battery control apparatus estimates the EOL of the battery based on the expected time information.

The battery control apparatus transmits the estimated EOL to the ECU. The ECU displays the EOL received from the battery control apparatus.

Figure 16:
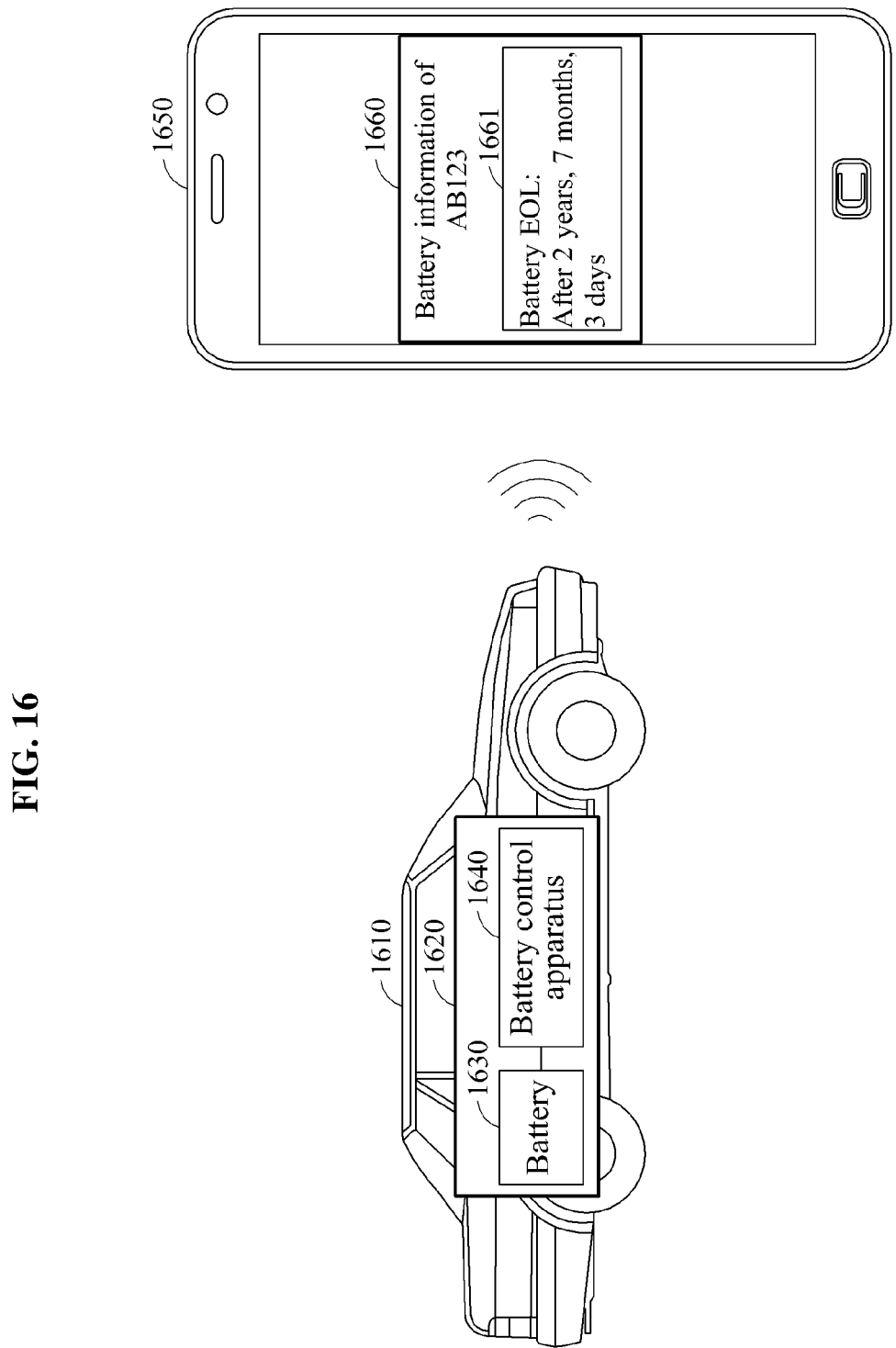
FIG. 16 illustrates an example of a user interface to provide battery life information, in accordance with an embodiment.

FIG. 16 illustrates an example of a user interface to provide battery life information, in accordance with an embodiment.

Referring to FIG. 16, an EV 1610 includes a battery system 1620. The battery system 1620 includes a battery 1630, and a battery control apparatus 1640. The battery control apparatus 1640 extracts an EOL of the battery 1630, and transmits the EOL of the battery 1630 to a terminal 1650 using a wireless interface.

In an example, the battery control apparatus 1640 receives a trigger signal from the terminal 1650 via the wireless interface, and estimates an EOL 1661 of the battery 1630 in response to the trigger signal. The battery control apparatus 1640 transmits the EOL 1661 to the terminal 1650 using the wireless interface. The terminal 1650 displays the EOL 1661 using a user interface 1660.

Figure 17:
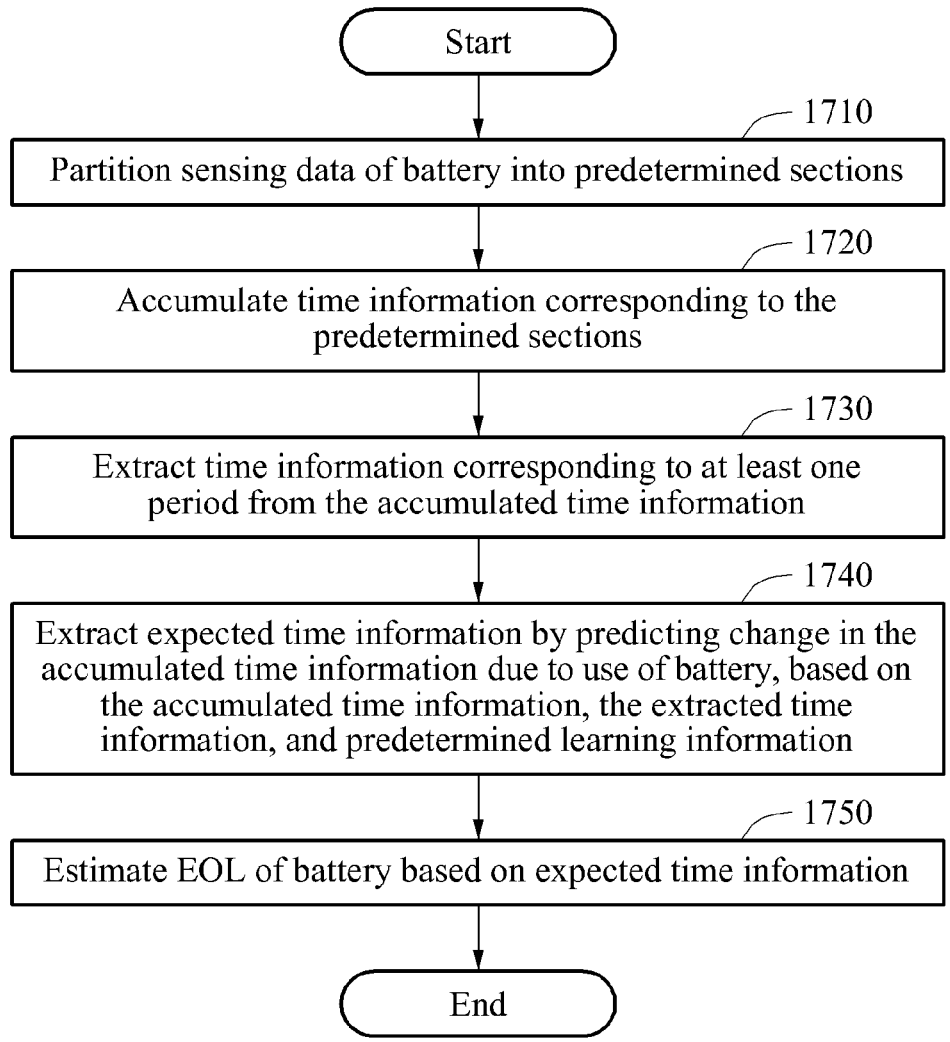
FIG. 17 illustrates an example of a battery life estimation method, in accordance with an embodiment.

FIG. 17 illustrates an example of a battery life estimation method, in accordance with an embodiment.

In operation 1710, a battery life estimation apparatus partitions sensing data of a battery into predetermined sections.

In operation 1720, the battery life estimation apparatus accumulates time information corresponding to the predetermined sections.

In operation 1730, the battery life estimation apparatus extracts time information corresponding to at least one period from the accumulated time information.

In operation 1740, the battery life estimation apparatus extracts expected time information by predicting a change in the accumulated time information due to battery use, based on the accumulated time information, the time information corresponding to the at least one period, and predetermined learning information.

In operation 1750, the battery life estimation apparatus estimates an EOL of the battery based on the expected time information.

The description of FIGS. 1 through 16 is equally applicable to the battery life estimation method of FIG. 17 and accordingly, will not be repeated here.

Figure 18:
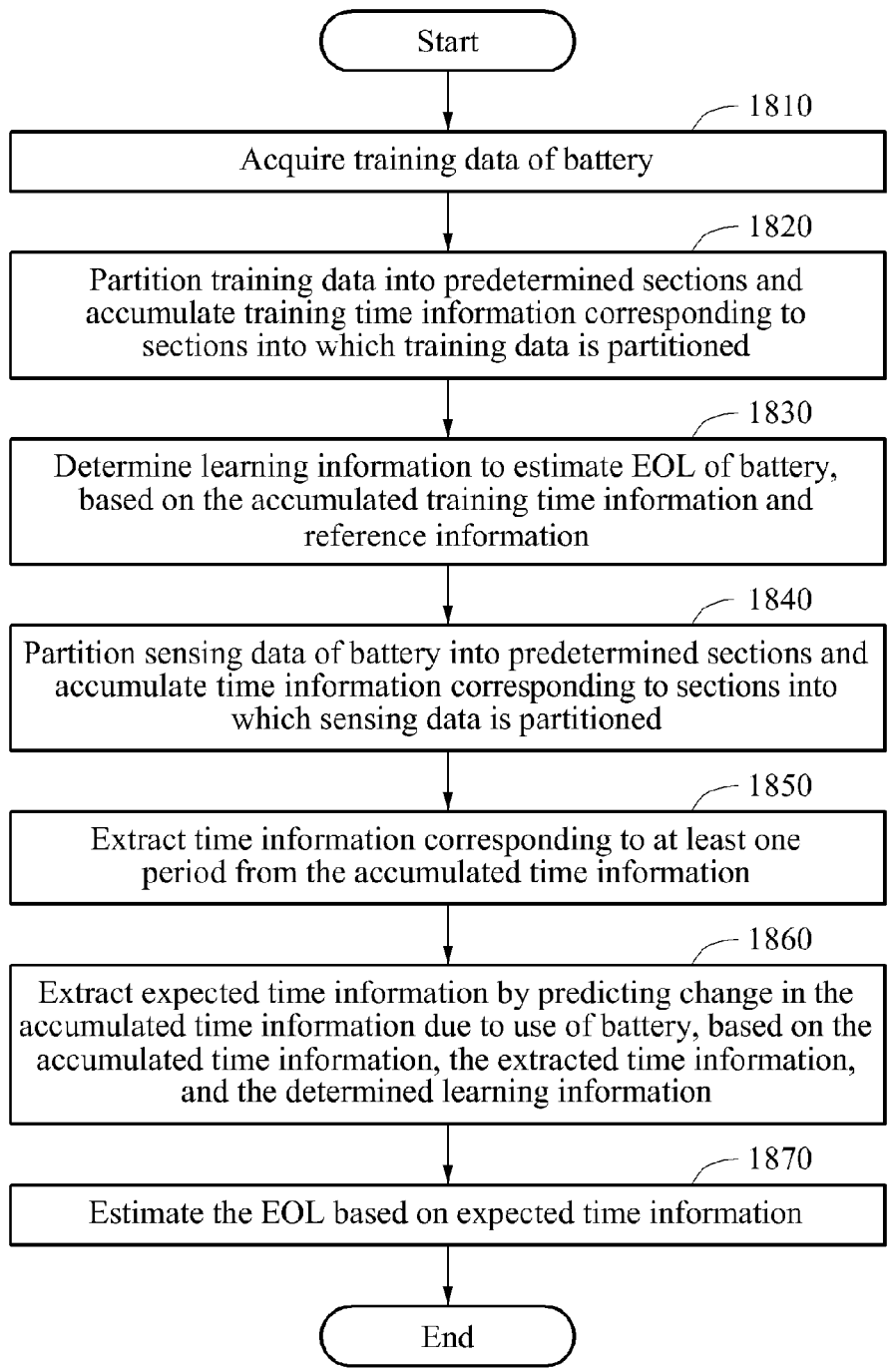
FIG. 18 illustrates another example of a battery life estimation method, in accordance with an embodiment.

FIG. 18 illustrates another example of a battery life estimation method, in accordance with an embodiment.

Referring to FIG. 18, in operation 1810, a battery life estimation apparatus acquires training data of a battery.

In operation 1820, the battery life estimation apparatus partitions the training data into predetermined sections, and accumulates training time information corresponding to the sections into which the training data is partitioned.

In operation 1830, based on the accumulated training time information and reference information, the battery life estimation apparatus determines learning information that is used to estimate an EOL of the battery.

In operation 1840, the battery life estimation apparatus partitions sensing data into predetermined sections, and accumulates time information corresponding to the sections into which the sensing data is partitioned.

In operation 1850, the battery life estimation apparatus extracts time information corresponding to at least one period from the accumulated time information.

In operation 1860, the battery life estimation apparatus extracts expected time information by predicting a change in the accumulated time information due to use of the battery, based on the accumulated time information, the time information corresponding to the at least one period, and the determined learning information.

In operation 1870, the battery life estimation apparatus estimates an EOL of the battery based on the expected time information.

The description of FIGS. 1 through 16 is equally applicable to the battery life estimation method of FIG. 18 and accordingly, will not be repeated here.

The accumulators, extractors, estimators, partitioners, transformers, learners, detectors, sensors, and storage described herein are implemented using structural hardware components. For example, the hardware components may include modules, controllers, servers, memories, converters, and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

It is to be understood that in the embodiment of the present invention, the operations in FIGS. 17-18 are performed in the sequence and manner as shown although the order of some operations and the like may be changed without departing from the spirit and scope of the described configurations. In accordance with an illustrative example, a computer program embodied on a non-transitory computer-readable medium may also be provided, encoding instructions to perform at least the method described in FIGS. 17-18.

Program instructions to perform a method described in FIGS. 17-18, or one or more operations thereof, may be recorded, stored, or fixed in one or more non-transitory computer-readable storage medium. The non-transitory computer readable recording medium may include any data storage device that can store data which can be thereafter read by a computer system or processing device. Examples of the non-transitory computer readable recording medium include read-only memory (ROM), random-access memory (RAM), CD-ROMs, magnetic tapes, floppy disks, optical data storage devices. Also, functional programs, codes, and code segments that accomplish the examples disclosed herein can be easily construed by programmers skilled in the art to which the examples pertain based on and using the flow diagrams and block diagrams of the figures and their corresponding descriptions as provided herein.

As a non-exhaustive illustration only, a terminal or device described herein may refer to mobile devices such as a cellular phone, a personal digital assistant (PDA), a digital camera, a portable game console, and an MP3 player, a portable/personal multimedia player (PMP), a handheld e-book, a portable laptop PC, a global positioning system (GPS) navigation, a tablet, a sensor, and devices such as a desktop PC, a high definition television (HDTV), an optical disc player, a setup box, a home appliance, and the like that are capable of wireless communication or network communication consistent with that which is disclosed herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery life estimation apparatus, comprising:
   a time information accumulator configured to partition sensing data of a battery into sections, and to accumulate time information corresponding to the sections;
   a time information extractor configured to extract time information corresponding to at least one period of plural periods from the accumulated time information; and
   a life estimator configured to:
      predict a change in the accumulated time information due to battery use;
      generate expected time information, corresponding to the predicted change in the accumulated time information, based on the accumulated time information, the extracted time information corresponding to the at least one period, and learning information, the learning information being determined from training data; and
      estimate an end of life (EOL) of the battery based on the generated expected time information.

2. The battery life estimation apparatus of claim 1, wherein the time information accumulator is further configured to measure at least one of a voltage signal, a current signal, and a temperature signal of the battery in real time.

3. The battery life estimation apparatus of claim 1, wherein the time information extractor is further configured to set the at least one period based on a usage history of the battery.

4. The battery life estimation apparatus of claim 1, further comprising:
   a charge/discharge determiner configured to determine, based on a current signal of the battery, whether the battery is being charged or discharged.

5. The battery life estimation apparatus of claim 1, wherein the life estimator is further configured to add the time information corresponding to each of the plural periods to the accumulated time information in an order of a longest period to a shortest period among the plural periods, and to extract the expected time information for the generating.

6. The battery life estimation apparatus of claim 1, wherein in response to pieces of time information corresponding to each period, the life estimator is further configured to extract the expected time information, based on time information corresponding to sensed data among the pieces of time information for the generating.

7. The battery life estimation apparatus of claim 5, wherein the life estimator is further configured to set the accumulated time information as the expected time information, and to update the expected time information by adding the time information corresponding to each of the plural periods to the expected time information.

8. The battery life estimation apparatus of claim 7, wherein the life estimator is further configured to estimate a life of the battery based on the updated expected time information and the learning information, and configured to update, for each of the plural periods, the expected time information by adding the time information corresponding to each of the plural periods to the expected time information until the estimated life of the battery is a predetermined end of the life of the battery.

9. The battery life estimation apparatus of claim 8, wherein the life estimator is further configured to add time information corresponding to an n-th period to the expected time information, to which time information corresponding to each of a first period, as the longest period, through an (n−1)-th period is added until the estimated life of the battery is the predetermined end of the life of the battery.

10. The battery life estimation apparatus of claim 5, wherein the life estimator is further configured to estimate the EOL by adding up the plural periods of time corresponding to the time information added to the accumulated time information.

11. The battery life estimation apparatus of claim 8, wherein the life estimator is further configured to estimate a capacity of the battery based on the updated expected time information and the learning information, and configured to estimate the life of the battery based on the capacity of the battery.

12. The battery life estimation apparatus of claim 11, wherein the life estimator is further configured to determine the estimated end of the life of the battery meets the predetermined end of the life of the battery, in response to the estimated capacity of the battery being less than 0.8 times an initial capacity of the battery.

13. The battery life estimation apparatus of claim 11, further comprising:
   a dimension transformer configured to transform an input vector corresponding to the expected time information to reduce a dimension of the input vector,
   wherein the life estimator is further configured to estimate the capacity of the battery based on the transformed input vector and the learning information.

14. The battery life estimation apparatus of claim 13, wherein the life estimator is further configured to estimate the capacity of the battery from the longest period to the shortest period by transmitting the transformed input vector and the learning information to a learner.

15. The battery life estimation apparatus of claim 14, wherein the learner comprises one of a neural network, a hidden Markov model (HMM), a Bayesian network, a support vector machine (SVM), and a decision tree (DT).

16. The battery life estimation apparatus of claim 1, wherein the life estimator is further configured to receive the learning information from an external apparatus using a communication interface.

17. A battery life estimation apparatus, comprising:
a training time information accumulator configured to partition training data of a battery into sections, and to accumulate training time information corresponding to the sections;
a learning information determiner configured to determine learning information, based on the accumulated training time information and predetermined reference information of the battery, to estimate an end of life (EOL) of the battery;
a time information accumulator configured to partition sensing data of the battery into sections, and to accumulate time information corresponding to the sections;
a time information extractor configured to extract time information corresponding to at least one period of plural periods from the accumulated time information; and
a life estimator configured to generate expected time information by predicting a change in the accumulated time information due to battery use, based on the accumulated time information, the extracted time information corresponding to the at least one period, and the learning information, and configured to estimate the EOL based on the generated expected time information.

18. The battery life estimation apparatus of claim 17, further comprising:
a training data acquirer configured to acquire the training data of the battery and to measure at least one of a voltage signal, a current signal, and a temperature signal of the battery in real time.

19. The battery life estimation apparatus of claim 17, wherein the learning information determiner is further configured to learn a parameter corresponding to the learning information by transmitting the accumulated time information and the reference information to a learner.

20. The battery life estimation apparatus of claim 17, wherein the learning information determiner is further configured to transmit the learning information to an external apparatus using a communication interface.

21. A processor-implemented method of estimating a life of a battery, the processor-implemented method comprising:
accumulating time information corresponding to sections of partitioned sensing data;
extracting time information corresponding to at least one period of plural periods from the accumulated time information;
predicting a change in the accumulated time information due to use of the battery;
generating expected time information, corresponding to the predicted change in the accumulated time information, based on the accumulated time information, the extracted time information, and determined usage history information of the battery, the determined usage history including patterns of using the battery; and
estimating an end of life (EOL) of the battery based on the generated expected time information.

22. The method of claim 21, further comprising:
adding the time information corresponding to each of the plural periods, which comprise the period, to the accumulated time information in an order of a longest period to a shortest period among the plural periods.

23. The method of claim 22, further comprising: setting the accumulated time information as the expected time information, and to update the expected time information by adding the time information corresponding to each of the plural periods to the expected time information.

24. The method of claim 23, further comprising:
estimating a life of the battery based on the updated expected time information and the learning information; and
updating, for each of the plural periods, the expected time information by adding the time information corresponding to each of the plural periods to the expected time information until the estimated life of the battery does not end.

25. The method of claim 24, further comprising:
estimating a capacity of the battery based on the updated expected time information and the learning information; and
estimating the life of the battery based on the capacity of the battery.

26. The method of claim 25, further comprising:
determining an end of the life of the battery, in response to the estimated capacity of the battery being less than 0.8 times an initial capacity of the battery.

* * * * *